United States Patent [19]

Labrousse et al.

[11] Patent Number: 4,808,860
[45] Date of Patent: Feb. 28, 1989

[54] FILTER CIRCUIT FOR A MOS-TYPE INTEGRATED DEVICE, AND AN INTEGRATED DEVICE COMPRISING SUCH A FILTER CIRCUIT

[75] Inventors: Jean-Michel J. Labrousse, Paris; Christian Paquet, Fontenay aux Roses, both of France

[73] Assignee: U. S. Philips Corporation, New York, N.Y.

[21] Appl. No.: 196,837

[22] Filed: May 9, 1988

Related U.S. Application Data

[63] Continuation of Ser. No. 26,225, Mar. 16, 1987, abandoned.

[30] Foreign Application Priority Data

Mar. 25, 1986 [FR] France ................. 86 04226

[51] Int. Cl.$^4$ ............... H03K 17/687; H03K 3/33; H03K 3/01; H03K 17/16
[52] U.S. Cl. ..................... 307/572; 307/303; 307/297; 307/296 R; 307/568; 307/543; 307/443
[58] Field of Search ............ 307/296 R, 297, 303, 307/443, 572, 556, 555, 543, 568, 520, 200 A, 200 B; 328/165

[56] References Cited

U.S. PATENT DOCUMENTS

4,295,176  10/1981  Wittwer ........................ 361/91
4,596,936   6/1986  Aoyama ....................... 307/268

Primary Examiner—Stanley D. Miller
Assistant Examiner—Richard Roseen
Attorney, Agent, or Firm—Steven R. Biren

[57] ABSTRACT

A circuit for a MOS-type integrated device includes two cross-coupled drain-gate transistors. In order to supply filtered voltages V'DD and V'SS which are equivalent to VDD and VSS, an N-channel first transistor has its source connected to VSS and its drain supplies the voltage V'SS, while a P-channel second transistor has its source connected to VDD, and its drain supplies the voltage V'DD. A third transistor may also be provided in order to accelerate the initial switching of the circuit should its state not be appropriate when voltage is applied.

4 Claims, 1 Drawing Sheet

FILTER CIRCUIT FOR A MOS-TYPE INTEGRATED DEVICE, AND AN INTEGRATED DEVICE COMPRISING SUCH A FILTER CIRCUIT

This is a continuation of application Ser. No. 026,225, filed Mar. 16, 1987, now abandoned.

BACKGROUND OF THE INVENTION

The invention relates to a filter circuit in an integrated device of the type comprising MOS transistors powered via two terminals, one of which (positive) is referred to as VDD while the other terminal, carrying the reference voltage zero, is referred to as VSS, which filter circuit comprises two MOS transistors, the gate of each transistor being connected to the drain of the other transistor.

In a general sense, it is often desirable to filter signals at a predetermined stage of processing in an integrated device, on the one hand in order to eliminate parasitic signals which are liable to produce error signals on the output and/or on the other hand to avoid the destruction of vulnerable elements of the device during the passage of high amplitude parasitic signals. It is to be noted that MOS transistors are known to be very vulnerable because of their gate electrode. This electrode is actually isolated from the substrate by way of a thin dielectric layer which is liable to be pierced in an irreversible manner when voltages in excess of a few tens of volts are applied.

In an integrated device usually a protection element, for example a zener diode, is provided in the direct vicinity of the signal input terminals and possibly the output terminals in order to limit the voltage across each terminal to a suitable maximum value, the useful signals, having an amplitude which is lower than this maximum value, not being affected by this protection element. The digital processing of the signals may also involve one or more filtering steps in order to eliminate the noise contained in the input signals, thus reducing the risk of incorrect output results due to the noise or parasitic signals.

It will be apparent that a filter circuit which serves to eliminate noise signals having a frequency which is higher than the operating frequency (for example, a low pass filter) inherently tends to reduce the amplitude and hence protect the vulnerable elements of the integrated device, at least in as far as very brief parasitic signals are concerned.

A filter circuit of the kind set forth is known from French Patent Specification No. 2,045,050.

This document describes how a signal can be shaped by application to a filter circuit having a hystersis response curve as well as the properties of an RC-type low-pass filter.

SUMMARY OF THE INVENTION

It is the object of the invention, however, to provide a solution to a slightly different problem, because it does not aim to process an actual digital signal but rather aims to supply given sensitive points of an integrated device with voltages VDD and VSS which themselves are liable to carry very brief parasitic fluctuations having an external or internal origin.

To achieve this, a filter circuit in an integrated device of the type comprising MOS transistors powered via two terminals, one of which (positive) is referred to as VDD while the other terminal, carrying the reference voltage zero, is referred to as VSS, which filter circuit comprises two MOS transistors, the gate of each transistor being connected to the drain of the other transistor, is characterized in that, in order to supply the voltages VDD and VSS to the gates of other transistors of the integrated device, said two transistors of the filter circuit are of the complementary type, the drain of the first transistor, whose source is connected to VSS, forming an output for a filtered voltage V'SS which approximates VSS, the drain of the second transistor, whose source is connected to VDD forms an output for a filtered voltage V'DD which approximates VDD.

In principle, such a circuit has two possible states, i.e. a state in which the two transistors are in a state of high impedance and another state in which they are both turned on. The latter state, however, is very stable while the first state is not stable and depends on the loads applied to the outputs V'DD and V'SS. Because the filter circuit in accordance with the invention serves exclusively for powering MOS transistor gates, the output loads of this circuit are purely capacitive, which means an extremely high impedance. In comparison, the drain-source impedance of the two transistors is much lower in their turned-off state, so that in the unfavorable case where the filter circuit is briefly in its turned-off state when voltage is applied, it necessarily returns to its stable state in which it outputs the above mentioned filtered voltages V'DD and V'SS.

These voltages can be safely applied to the gates of the MOS transistors for specific uses, while the non-filtered voltages VDD and VSS are applied in known manner to the drains or the sources of the transistors of the remainder of the integrated device, the latter electrodes not being as vulnerable as gates.

For example, the application of the voltages V'DD and V'SS directly to the gates of MOS transistors may be necessary in order to obtain either well-defined resistance values or a voltage which has been shifted below VDD by the amount of a threshold voltage, or to set an input of a functional block to "1" or "0", notably in the case of a test circuit which, during an intermediate development stage, comprises only part of the functional blocks to be provided, the fixed setting, taking the place of the output signal of a block provisionally omitted at this stage of development.

When voltage is applied, the filter circuit in accordance with the invention may require a given period of time in order to reach its turned-on state: generally, this is not a drawback, considering that the initialization procedure for a complex logic circuit, for example a microprocessor, is sufficiently long to allow correct setting of the filter circuit.

However, if desired, the period of time required by the filter circuit in order to reach its stable state when voltage is applied can be considerably reduced in a preferred version in accordance wiith the invention in that the device comprises a third transistor whose source is connected to one of the voltages VSS or VDD, while its gate and its drain are connected together to the equivalent filtered voltage output V'SS or V'DD.

This third transistor may be an N-channel MOS transistor, its source then being connected to VSS while its gate and its drain are connected together to the output V'SS. In the unfavorable event that the output V'SS has a positive potential at the instant of application of the voltage, so that the first and second transistors are turned off at that instant, the third transistor will be turned on, thus rapidly reducing the output voltage V'SS until the second transistor is turned on and accelerates the setting of the circuit to its final stable state. In the latter state, the third transistor is no longer turned on so that its operation is limited to a brief instant upon initialization, i.e. only if the unfavorable state occurs. It will be understood that, in order to perform this function, the third transistor need not be highly conductive during its turned-on state. It will also be apparent that for this purpose use can be made of the smallest transistor which is compatible with the tolerances of the process used. For reasons of symmetry of the circuit in accordance with the invention, instead of an N-channel transistor a P-channel transistor can also be used as the third transistor. In that case its source is connected to VDD while its gate and its drain are connected together to the output V'DD.

The operation and the result will be similar to that of the previous case, with the exception of the initialization delay, if any, which will be a slightly longer due to the lower conductivity of a P-channel transistor in comparison with that of an N-channel transistor of the same size.

BRIEF DESCRIPTION OF THE DRAWING

Other details will become apparent from the following description which is given, by way of example, with reference to the accompanying drawing.

DESCRIPTION OF THE PREFERRED EMBODIMENTS

Figure 1:
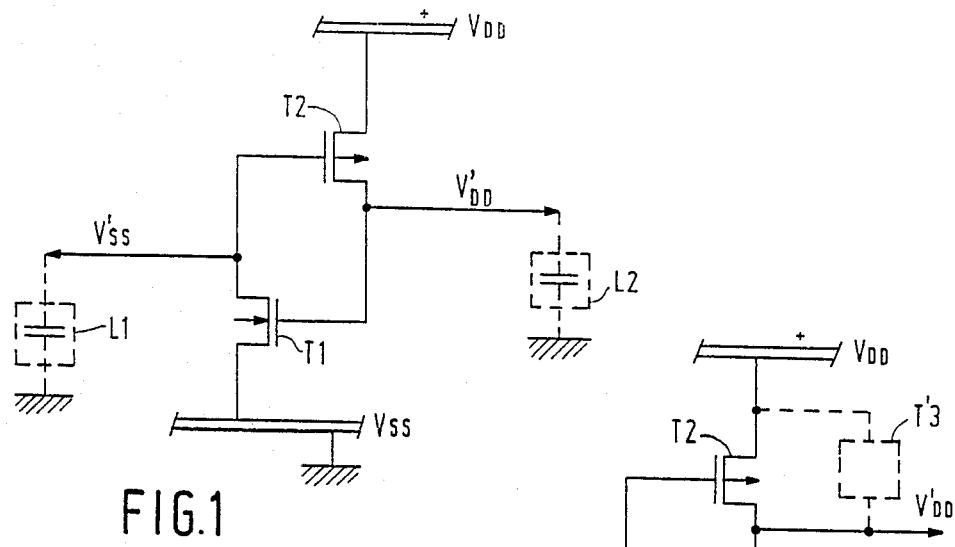
FIG. 1 shows an electrical diagram of the filter circuit in accordance with the invention.

FIG. 1 shows the diagram of a filter circuit in accordance with the invention which comprises two transistors, i.e. a first transistor T1 of the N-channel MOS type whose source is connected to the power supply rail carrying the voltage VSS and whose drain is connected to the gate of a second transistor T2 which is of the P-channel MOS type. The source of the transistor T2 is connected to the power supply rail carrying the positive voltage VDD, while its drain is connected to the gate of the transistor T1. The common junction of the drain of the transistor T1 and the gate of the transistor T2 supplies a filtered output signal V'SS which approximates VSS. Analogously, the common junction of the drain of the transistor T2 and the gate of the transistor T1 supplies a filtered output voltage V'DD which approximates VDD.

As has already been indicated, the output voltages V'SS and V'DD serve to power the gates of other MOS transistors of the integrated device. Moreover, the loads applied to these outputs, symbolized as L1 and L2 (denoted by broken lines), themselves are purely capacitive by nature. Therefore, when the filter circuit shown is in such a state upon activation that the transistors T1 and T2 are turned off, the source drain path of these transistors will have an impedance which is substantially lower than the purely capacitive impedance of the gates of the MOS transistors, so that this circuit will necessarily switch to its stable state in which the transistors T1 and T2 are both turned on. In this state, sustained by the drain-gate cross coupling of the transistors T1 and T2, the voltages VSS and VDD are applied, via the respective conductive paths of the transistors T1 and T2, to the respective equivalent outputs V'SS and V'DD.

The insertion of the conductive paths T1 and T2, whose resistance may amount to some hundreds of ohms, in combination with the stray capacitances of the electrodes with respect to the substrate, has the effect of a low-pass filter which attenuates the parasitic signals, having very steep edges, possibly present on the power supply rails. The transistors whose gates are biassed on the basis of $V \propto SS$ or V'DD are thus protected against the steep overvoltages which are liable to damage the insulating dielectric of said gates.

Figure 2:
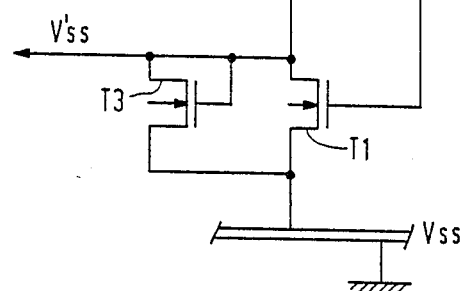
FIG. 2 shows an electrical diagram of an alternative version of the filter circuit in accordance with the invention.

FIG. 2 shows the electrical diagram of an alternative embodiment of the filter circuit shown in FIG. 1; the elements which correspond to those shown in FIG. 1 are denoted by the same reference numerals.

In comparison with the circuit shown in FIG. 1, the circuit shown in FIG. 2 differs only in the addition of a third transistor T3 of the P-channel MOS type whose source is connected to the source of the transistor T1 and whose gate and drain are connected together to the junction forming the output for the voltage V'SS. The transistor T3 is turned on only for a very brief period of time when the voltage is applied and only if the junction carrying the voltage V'SS were to carry a positive voltage and the junction carrying the voltage V'DD were to carry at the same time a voltage which is approximately equal to or lower than VSS.

The electric loads carried by the conductors of the junction V'SS are thus very rapidly decreased to VSS by the transistor T3 because during this process the transistor T2 subsequently accelerates the switching because it is turned on itself. When the voltage V'SS reaches the value of the voltage VSS, the transistor T3 ceases to be turned on and remains in this turned-off state during the further operation of the device. The transistor T3 thus serves exclusively for accelerating the process of switching the filter circuit to its final state when voltage is applied, that is to say only when such switching is necessary.

The diagram of FIG. 2 shows the use of a transistor T3 which serves to accelerate the switching of the circuit formed by the transistors T1 and T2 when the transitory state of this circuit is detrimental at the instant of switching on. However, the same effect can be obtained by omitting the transistor T3 and adding a transistor T'3 of the P-channel MOS type whose source is connected to the source of the transistor T2 and whose gate and drain are connected together to the output junction carrying the voltage V'DD; the arrangement of the transistor T'3 is diagrammatically denoted by broken lines in FIG. 2.

Figure 3:
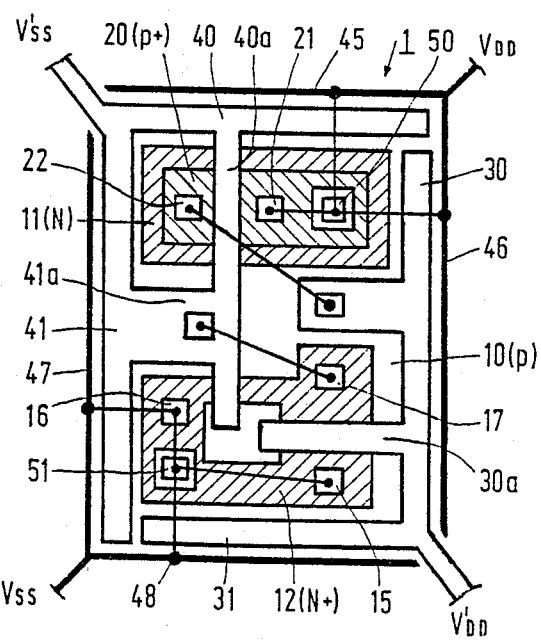
FIG. 3 is a plan view of a preferred embodiment of the circuit shown in FIG. 2, the metallic connections being denoted by symbols.

FIG. 3 shows a particularly attractive embodiment of the circuit of FIG. 2 in the form of a pattern 1 having a substantially rectangular contour.

In order to realize the active zones and the conductor contacts, use is made of techniques which are well known from the field of integrated devices utilizing complementary MOS transistors and which will not be described herein.

The semiconductor substrate 10, being of the P type, is shown in the form of clear zones in the FIGURE in as far as it is visible at the surface. An N type surface region 11, referred to as a "pocket N", is located at the surface of the substrate 10 in order to receive the active regions of the P-channel transistor T2. Another surface region 12, being of the type N+ and being shaped substantially as a loop, at the same time forms the source and drain regions of the transistors T1 and T3.

The transistors T1 and T3 comprise a source contact window 15, 16, respectively, while the drain region is common to these two transistors and comprises a drain contact window 17.

The source and drain regions of the transistor T2 are formed by a surface zone 20 of the type P+ which is contained in the pocket N 11 in which there are situated the source contact window 21 and the drain contact window 22.

The gate of the transistors T1, T2 and T3 of the present embodiment is formed by a layer of a polycrystalline semiconductor material which is rendered conductive by doping. This layer is subdivided into two portions which are insulated from one another. The first portion has an L-shaped border which extends along two adjacent sides of the pattern 1 and a branch 30 of which forms the gate of the transistor T1 by way of a tooth 30a which extends towards the interior of the circuit. The function of the branch 31 of the same portion will be described hereinafter. The second portion of the polycrystalline layer also has an L-shaped border and is situated symmetrically with respect to the center of the rectangle formed by the pattern 1 of the circuit and a branch 40 of which forms the gate of the transistor T2 by way of a tooth 40a which extends towards the interior of the circuit, the other branch 41 forming, by way of a tooth 41a (however, connected to the tooth 40a), the gate of the transistor T3.

A metal contact layer is situated at the upper level and is insulated from the other electrodes and regions, except at the areas of the contact windows; this layer is cut so as to obtain the required configuration which is symbolically shown in FIG. 3 for the sake of clarity.

L-shaped metal contact portions 30–31 and 40–41 are in a first layer. L-shaped metal contact portions 45–46 and 47–78 are in a second layer. The first and second layers are sandwiched together with an insulation layer inbetween. Portions 45 and 46 are positioned over portions 30 and 40 and portions 47 and 48 are positioned over portions 31 and 41 so that all L-shaped portions are positioned over opposite parts of the other L-shaped portions and the four vertices of the four L-shaped metal contact portions are located one each in each of the four corners of the rectangular contour of the circuit pattern.

The drawing of FIG. 3 shows the branches 45, 46–47, 48 of the borders of the contact layer (upper level) which are placed outside of the branches 30, 31–40, 41 of the polycrystalline layer (of the lower level). However, this representation is given merely for the sake of clarity of the FIGURE and it will be apparent that in practice the two branches extending along the same side may be superimposed because they are insulated from one another by a dielectric layer.

The branches 45 and 46 carry the voltage VDD and are connected, via the contact window 50, to the pocket N11 and to the source contact window 21 of the transistor T2.

The branches 47 and 48 carry the voltage VSS and are connected to a substrate contact window 51, to the source contact window 16 of the transistor T3, and to the source contact window 15 of the transistor T1.

The branches 30 and 31, forming the border of a portion of the polycrystalline layer, supply the voltage V'DD and are connected to the drain contact window 22 of the transistor T2. The branches 40 and 41, forming the border of the other portion of the polycrystalline layer, supply the voltage V'SS which is applied to the common drain contact window 17 of the transistors T1 and T3.

An essential advantage of this particular arrangement is the good accessibility of the four voltages of the pattern, via short connections, at any point of the four L shaped borders, taking into account the fact that the pattern 1 can be implanted in four different orientations which are derived from one another by rotation through one quarter turn. The representation of the inputs and outputs of VSS, VDD, V'SS, V'DD in diagonals in the corners of the L shaped borders, has only been given by way of example and it will be apparent that in practice these inputs and outputs are arranged in any suitable position as a function of the topography of the relevant integrated device.

The invention also relates to an application of the described filter circuit in an complex integrated device which is subdivided into functional blocks distributed across the surface of the semiconductor substrate; in this application the filter circuit is implanted as many times as the integrated device comprises specific functional blocks requiring powering of the gate of the transistor by at least one of the fixed voltages VSS and VDD, each individual filter circuit being arranged in the vicinity of one of said specific functional blocks and powering exclusively the transistors contained in this block.

This application offers the advantage that an excellent filtering efficiency is obtained, because the non-filtered lines VSS and VDD are the long lines and the filtered lines V'SS and V'DD are the short lines which, therefore, are less subject to the effects of the parasitic signals originating from within.

Moreover, filter circuit patterns such as the pattern shown in FIG. 3 can have a very small size (36×50 micrometers); therefore, they occupy only very little space on the complex integrated device and ensure a comparatively independent powering of each of the specific functional blocks for which of the gate of the transistor must be connected to the one or the other fixed voltage.

What is claimed is:

1. A filter circuit for use in an integrated device of the type comprising a plurality of MOS transistors, each having a gate, and having a positive power terminal VDD and a reference voltage power terminal VSS, said filter circuit comprising first and second complementary MOS transistors, each of these two complementary MOS transistors having a gate, a source and a drain, the gate of each of said two transistors being connected to the drain of the other of said two transistors, the source of said first transistor being connected to VSS and its drain comprising a first output terminal for providing a first filtered voltage output V'SS which is approximately equal to VSS, and the source of said second transistor being connected to VDD and its drain comprising a second output terminal for providing a second filtered voltage output V'DD which is approximately equal to VDD, said first and second filtered voltages being selectively applied to the gates of said plurality of transistors of the integrated device.

2. A filter circuit as claimed in claim 1, further comprising a third transistor having a gate, a source and a drain, whose source is connected to one of the voltages VSS and VDD, while its gate and its drain are connected together to the corresponding one of filtered voltage outputs V'SS and V'DD.

3. A filter circuit as claimed in claim 2 and constructed by integration in a semiconductor substrate in the form of a pattern having a substantially rectangular contour, and comprising two distinct levels of conductive contact layers, characterized in that the voltages VSS, VDD, V'SS, V'DD are carried by conductive layer portions, two of these voltages being present for two insulated portions of the same conductive layer, the conductive layer portions each having a respective L shaped border which extends along two adjacent sides of said rectangular contour, the L shaped borders being arranged in opposite pairs with respect to the center of the pattern of two portions of a layer on the same level, the layout of the second level being arranged with respect to the layout of the first level in such a manner that the vertex of one of said L shaped borders of the conductive layer portions is located in each corner of said substantially rectangular contour.

4. An integrated device comprising a filter circuit as claimed in claim 2 which integrated device is subdivided into functional blocks distributed across the surface of the semiconductor substrate, characterized in that said filter circuit is implanted as many times as the integrated device comprises specific functional blocks requiring powering of gate of the transistor by at least one of the voltages, each individual circuit being arranged in the vicinity of one of said specific functional blocks and powering exclusively the transistors contained in that block.

* * * * *